United States Patent [19]
Murakami et al.

[11] Patent Number: 4,980,522
[45] Date of Patent: Dec. 25, 1990

[54] OPERATING KEY SWITCH UNIT

[75] Inventors: Takashi Murakami; Yoshihiro Hattori, both of Hyogo, Japan

[73] Assignee: Mitsubishi Denki Kabiushiki Kaisha, Hyogo, Japan

[21] Appl. No.: 464,674

[22] Filed: Jan. 16, 1990

Related U.S. Application Data

[63] Continuation of Ser. No. 301,041, Jan. 24, 1989, abandoned.

[30] Foreign Application Priority Data

Jun. 13, 1988 [JP] Japan ................................ 63-145165

[51] Int. Cl.[5] ........................ H01H 13/06; H05K 5/00
[52] U.S. Cl. ..................................... 200/5; 200/302.2; 361/399
[58] Field of Search ............... 200/5 R, 5 A, 511–517, 200/302.1–302.3, 341–345; 361/380, 398, 399

[56] References Cited

U.S. PATENT DOCUMENTS 4,074,118 2/1978 Washizuku et al. ............ 361/380 X
4,117,279 9/1978 Schomer ....................... 200/302.2 X
4,491,702 1/1985 Kato ................................ 200/513 X
4,570,039 2/1986 Osawa et al. .................... 200/517 X
4,768,230 8/1988 Viebrantz et al. ........... 200/302.2 X

FOREIGN PATENT DOCUMENTS 0210973 2/1987 European Pat. Off. .
61-11422 4/1986 Japan .
61-36024 10/1986 Japan .

*Primary Examiner*—J. R. Scott

[57] ABSTRACT

The operating key switch unit according to the present invention includes a plurality of key switch buttons exposed from the front of a waterproof case and a switch panel integrally formed therein using an elastic material and mounted with bolts between the waterproof case and a printed circuit board. Furthermore, a first contactor projecting in the key switch button operating direction annularly in a surrounding relation to the key switch buttons is provided, and a second annular contactor formed integrally with the switch panel and in contact with the first contactor throughout the overall circumference at all times is provided.

2 Claims, 4 Drawing Sheets

FIG. 9
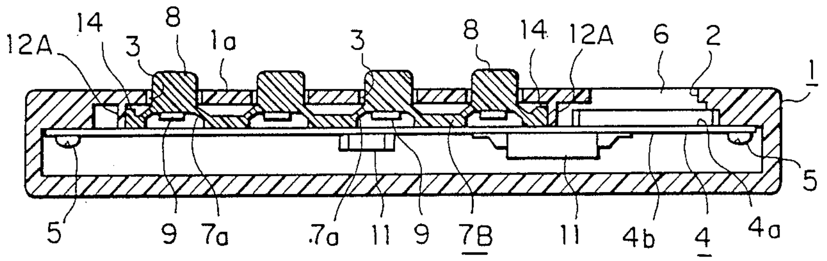
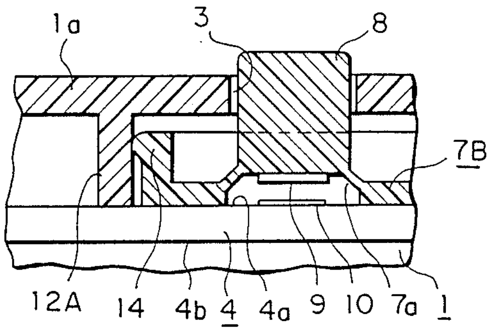
FIG. 10
FIG. 11
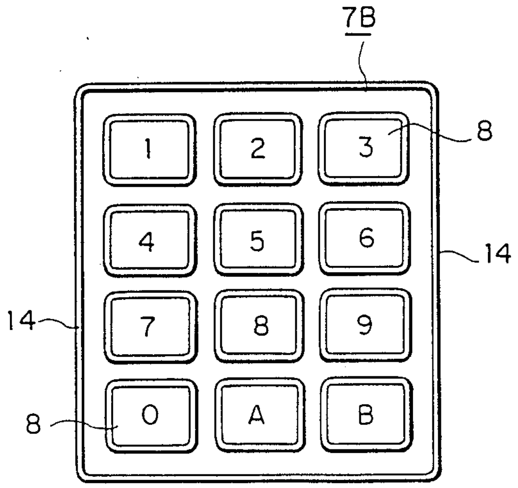
FIG. 12
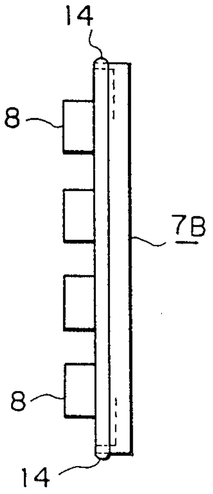

OPERATING KEY SWITCH UNIT

This application is a continuation of application Ser. No. 07/301,041 filed on 1/24/89, now abandoned.

BACKGROUND OF THE INVENTION

1. Field of the Invention

The present invention relates to an operating key switch unit having a waterproof case with an electric circuit enclosed therein, and a plurality of key switch buttons for external operation that are exposed on the front of the case.

2. Description of the Prior Art

A conventional operating key switch unit will be described with reference to FIGS. 1 to 4. FIG. 1 is a perspective view showing an appearance of the switch unit; FIG. 2 is a sectional view taken on line II—II of FIG. 1; FIG. 3 is a partially enlarged view of FIG. 2; and FIG. 4 is a front view of a switch panel. In these figures, a waterproof case 1 is molded from a resin; a display opening 2 is formed on the case front 1*a* of the case 1; a plurality of button holes 3 are formed (twelve in the drawings) on the case front 1*a* of the case 1; a printed circuit board 4 is mounted in the case 1 using bolts 5; and a display portion 6 is displaced inserted in the display opening 2 between a front-side surface 4*a* of the printed circuit board 4 and the case front 1*a*. A switch panel 7 is a panel switch inserted between the front-side surface 4*a* of the printed circuit board 4 and the case front 1*a*. Key switch buttons 8 are exposed respectively from the button holes 3 and formed integrally with the switch panel 7 using an elastic material for allowing external operation. An electroconductive contact 9 of each key switch button 8 is integral with the switch panel 7, and the electroconductive contact 9 is provided in a recess 7*a*. A contact 10 is printed on the front-side surface 4*a* of the printed circuit board 4 opposite to each electroconductive contact 9. An electronic part 11 is mounted on a back-side surface 4*b* of the printed circuit board 4.

The operation of the conventional key switch unit of the above construction will now be explained. The switch panel 7 is placed on the printed circuit board 4 having the electronic part 11 and the switch panel 7 is fixed to the case 1 with bolts 5. As a result, the key switch buttons 8 of the switch panel 7 are exposed from the button holes 3 of the case so that they can be operated from the exterior.

The contacts 10 on the printed circuit board 4 and the electroconductive contacts 9 of the switch panel 7 jointly form a switch structure. Normally, the contacts 9 and 10 are not in contact with each other as shown in FIG. 3, but when a key switch button 8 is depressed, the switch panel 7 is deformed through the associated recess 7*a*, so that the contacts 9 and 10 are in contact with each other. As a result, the contents of the operation are displayed on the display portion 6.

According to the conventional operating key switch unit described above, the panel switch 7 is integrally formed using an elastic material and the switch panel 7 is sandwiched between the front-side surface 4*a* of the printed circuit board 4 and the inner surface of the case front 1*a*. Thereby, invasion of water through the button holes 3 to the exterior of the switch panel 7 is prevented namely the interior of the case 1, through a surrounding contact portion 7*b* of the switch panel 7. However, the surrounding contact portion 7*b* of the switch panel 7 is held by a contact pressure induced by only the urging force of the bolts 5*a*. When the switch panel 7 is deformed in response to the depression of a key switch button 8, a change occurs in the contact pressure of the surrounding contact portion 7*b*, that is, a uniform contact pressure is not obtained. As a result, water enters the interior of the case 1 through the surrounding contact portion 7*b*, which causes the contacts 9 and 10 and the electronic part 11 to be corroded. Furthermore, if the mounting pitch of the bolts 5 is made smaller for increasing the contact pressure of the panel switch 7, the the number of bolts 5 increases which causes an increase in time that is required for the assembling operation, and an increase in cost of the unit.

SUMMARY OF THE INVENTION

The present invention has been provided for overcoming the above-mentioned problems and it is an object thereof to provide an operating key switch unit having a sure waterproof structure that does not require an increase in the number of switch panel fixing bolts.

The operating key switch unit according to the present invention is provided with a first contactor projecting from the inner surface of the front of the case substantially in the same direction as the key switch button operating direction and the first contactor is disposed annularly in a surrounding relation to the key switch buttons. A second annular contact is formed integrally with the panel switch and is contacted with the first contactor throughout the overall circumference at all times.

Thus, in the present invention, since the first contactor and the second contactor are in contact with each other at all times, the invasion of water to the exterior of the switch panel is prevented, namely, to the interior of the case, even when the switch panel is deformed upon the depression of a key switch button.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 9 is a side view, in a longitudinal direction, showing a second embodiment of the present invention;

FIG. 10 is a partially enlarged view of FIG. 9;

FIG. 11 is a front view of a switch panel; and

FIG. 12 is a right-hand side view of FIG. 11.

DETAILED DESCRIPTION OF THE PREFERRED EMBODIMENTS

Figure 1:
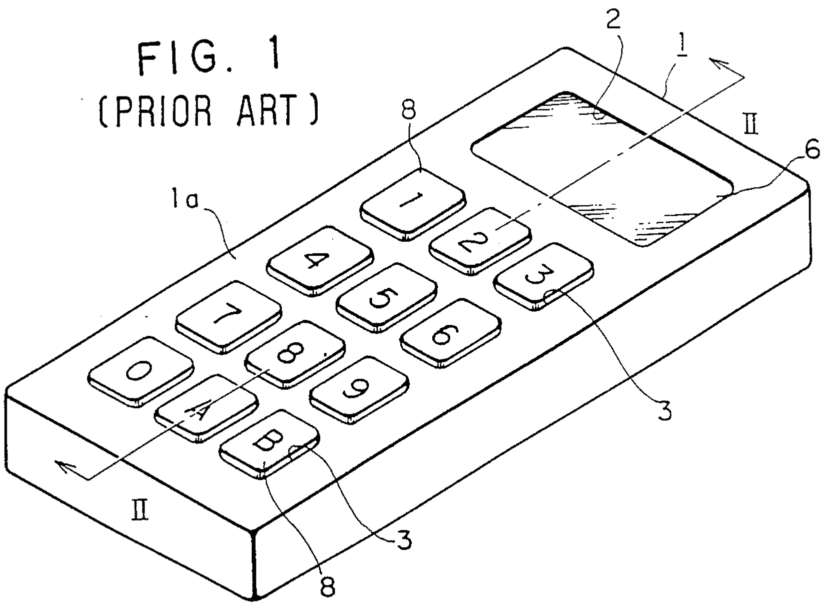
FIG. 1 (PRIOR ART)
FIG. 1 is a perspective view showing an appearance of a conventional key switch unit.
Figure 2:
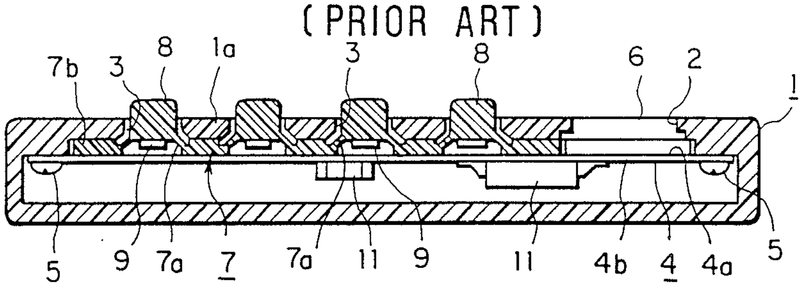
FIG. 2 (PRIOR ART)
FIG. 2 is a sectional view taken on line II—II of FIG. 1.
Figure 3:
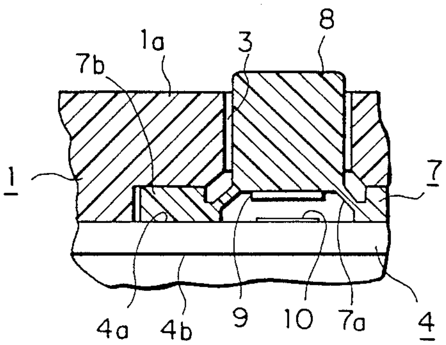
FIG. 3 (PRIOR ART)
FIG. 3 is a partially enlarged view of FIG. 2.
Figure 4:
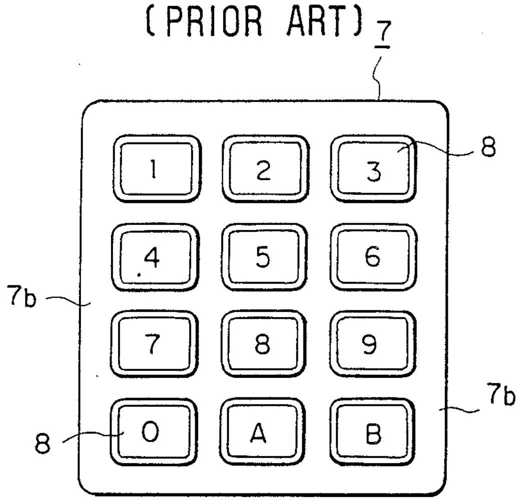
FIG. 4 (PRIOR ART)
FIG. 4 is a front view of a switch panel.
Figure 5:
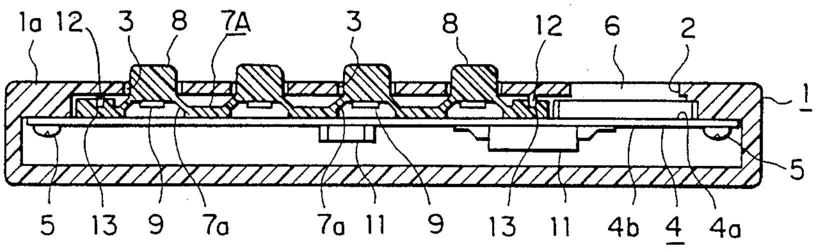
FIG. 5 is a side view, in a longitudinal direction, showing a first embodiment of the present invention.
Figure 6:
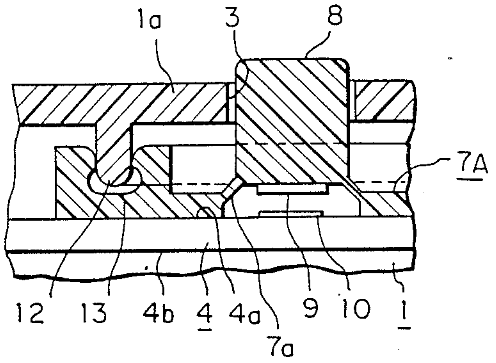
FIG. 6 is a partially enlarged view of FIG. 5.
Figure 7:
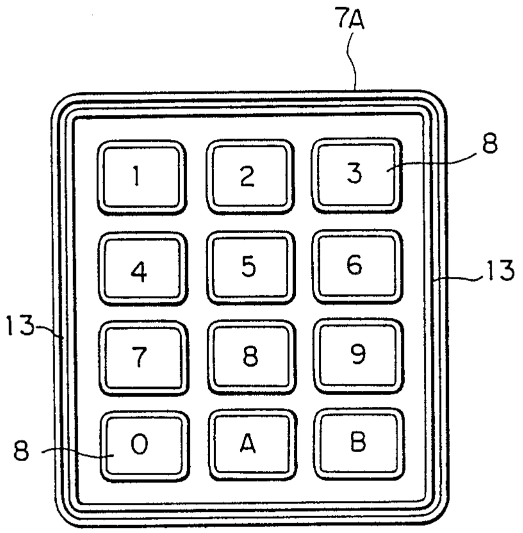
FIG. 7 is a front view of a switch panel.
Figure 8:
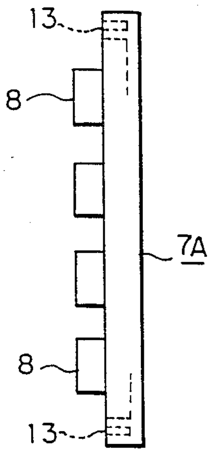
FIG. 8 is a right-hand side view of FIG. 7.

A first embodiment of the present invention will now be described with reference to FIGS. 5 to 8. FIG. 5 is a sectional view similar to FIG. 2; FIG. 6 is a partially enlarged view of FIG. 5; FIG. 7 is a front view of a switch panel; and FIG. 8 is a right-hand side view of FIG. 7. In these figures, portions which are the same as or equivalent to those of the of the foregoing conventional switch unit are indicated by the same reference numerals and will not be explained here. In these figures, a switch panel 7A is integrally formed using an elastic material; a convex portion 12 is formed on the inner surface of a case front 1*a* with the convex portion 12 extending annularly along the marginal portion of the panel switch 7A; and a concave groove 13 is formed annularly in the marginal portion of the switch panel 7A, in which the groove is fitted the convex portion 12.

Thus, the convex portion 12 of the case front 1*a* and the concave groove 13 of the switch panel 7A are fitted together. This is advantageous in that even when the switch panel switch 7A is deformed upon the depression of a key switch button 8, there will be not change in the contact pressure between the convex portion 12 and the concave groove 13 because they are in contact with each other in the same direction as the operating direction. Therefore, of the invasion of water to the exterior of the panel switch 7A is prevented, namely, to the interior of the case 1.

Although in the first embodiment the convex portion 12 and the concave groove 13 serve as first contactor and the second contactor, respectively, they may be reversed.

Now, a second embodiment of the present invention will be described with reference to FIGS. 9 to 12. FIG. 9 is a sectional view similar to FIG. 5; FIG. 10 is a partially enlarged view of FIG. 9; FIG. 11 is a front view of a switch panel; and FIG. 12 is a right-hand side view of FIG. 11, having figure portions which are the same as or equivalent to the portions in the first embodiment and the figure portions are indicated by the same reference numerals and will not be explained here. In these figures, a switch panel 7B is integrally formed using an elastic material, and a convex portion 12A formed on the inner surface of the case front 1*a* with the convex portion 12A being located annularly surrounding the outer periphery of the switch panel 7B and being contacted with a front-side surface 4*a* of the printed circuit board 4. A rib 14 is formed annularly on the outer periphery of the switch panel 7B and is contacted with the inner peripheral surface of the convex portion 12A.

Although in this embodiment the convex portion 12A and the rib 14 serve as the first and second contactors, respectively, they may be reversed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An operating key switch unit having an electric circuit enclosed in a waterproof case and a plurality of key switch buttons exposed on a front surface of the case, the operating key switch unit comprising:

- a printed circuit board mounted in the case by plurality of bolts for partitioning the interior of the case into a front portion and a back portion;
- a plurality of circuit board contacts formed on said printed circuit board in said front portion;
- a plurality of key switch buttons adjacent to said plurality of circuit board contacts for developing a connection thereto;
- a plurality of electronic parts disposed on said printed circuit boards in said back portion;
- a switch panel integrally formed with and connected to said plurality of key switch buttons, said switch panel having a flexible and elastic portion formed around said plurality of key switch buttons;
- a first contactor extending from the front surface of the case into said front portion and annularly surrounding said plurality of key switch buttons; and
- a second contactor protruding from said switch panel and forming a generally U-shaped section having a top part of the vertical legs of said U-shaped section having a more constricted separation than a bottom part of the vertical legs of said U-shaped section for providing a hermetical seal for said plurality of key switch buttons by continually contacting said first contact at both side portions thereof and at a right angle to the axis in which the key switch buttons are depressed.

2. An operating key switch unit according to claim 1, wherein said first contactor is formed as a convex portion and said second contactor is formed as a concave groove with said generally U-shaped section for engaging with said first contactor.

* * * * *